(12) United States Patent
Kamata et al.

(10) Patent No.: US 6,831,223 B2
(45) Date of Patent: Dec. 14, 2004

(54) ELECTROMAGNETIC SHIELDING PLATE AND ELECTROMAGNETIC SHIELDING STRUCTURE

(75) Inventors: Takeshi Kamata, Shizuoka (JP); Eiji Murofushi, Shizuoka (JP)

(73) Assignee: Yazaki Corporation, Tokyo (JP)

( * ) Notice: Subject to any disclaimer, the term of this patent is extended or adjusted under 35 U.S.C. 154(b) by 39 days.

(21) Appl. No.: 10/142,792

(22) Filed: May 13, 2002

(65) Prior Publication Data

US 2002/0167438 A1 Nov. 14, 2002

(30) Foreign Application Priority Data

May 11, 2001 (JP) ..................................... P2001-141794

(51) Int. Cl.$^7$ ................................................. H05K 9/00
(52) U.S. Cl. .................................. 174/35 MS; 428/328
(58) Field of Search ............................... 428/323, 328; 174/35 R, 35 MS; 361/816, 818

(56) References Cited

U.S. PATENT DOCUMENTS 4,423,097 A * 12/1983 Mons et al. ................. 427/423
6,250,362 B1 * 6/2001 Rioja et al. .................... 164/46

\* cited by examiner

*Primary Examiner*—Hung V. Ngo
(74) *Attorney, Agent, or Firm*—Sughrue Mion, PLLC

(57) ABSTRACT

An electromagnetic shielding plate (10) comprises hollow particle dispersed composite material which includes a metal matrix (11) containing therein hollow particles (12) formed of inorganic compound, and an electromagnetic shielding structure which includes a plurality of these electromagnetic shielding plates (10) which are connected to each other in two dimensions or in three dimensions.

4 Claims, 3 Drawing Sheets

ELECTROMAGNETIC SHIELDING PLATE AND ELECTROMAGNETIC SHIELDING STRUCTURE

BACKGROUND OF THE INVENTION

The present invention relates to an electromagnetic shielding plate having electromagnetic shielding function, and also to an electromagnetic structure composed of the electromagnetic shielding plates which are connected to each other in two dimensions or in three dimensions.

In order to transmit a large volume of electronic information with development of information and communication societies, signals having high densities and high frequencies have become popular in electronic apparatuses. On the other hand, however, there has frequently occurred such a trouble that electromagnetic wave arising from the electronic apparatuses may generate noise and cause radio disturbance in a peripheral equipment, and it has been an urgent necessity to take countermeasures against the trouble.

As the electromagnetic shielding measures, it has been a general practice that a filter circuit such as a high frequency filter is provided in a circuit-of the electronic apparatus itself. Moreover, the electromagnetic shielding measures are also adopted in a box containing this electronic apparatus or in a structure such as an architecture. For example, walls, a floor and a ceiling of an electromagnetic shielding room 1 as shown in FIG. 4 are composed of electromagnetic shielding plates 2.

However, as shown in an enlarged scale in FIG. 5, the related electromagnetic shielding plate 2 has been generally composed of electromagnetic shielding material 4 in a form of a thin metal plate, a metal impregnated plastic sheet, an electrically conductive coating film or the like which has been attached to a surface of a substrate 3 made of wood, gypsum, stone or the like. This electromagnetic shielding plate 2 has inevitably become larger in weight, since the substrate 3 has been made of heavy material. For this reason, requirement for enhancing strength of the base and skeleton of the structure has arisen, and there has occurred such a problem that the cost will be inevitably increased.

Moreover, nowadays, the electromagnetic shielding measures are required to be taken in a vehicle, because various electronic apparatuses having high frequency motions are mounted on the motor car in order to give functions of electronic control and communication. In case where these electronic apparatuses are contained inside the same electromagnetic shielding plates 2 as described above, weight of a vehicle body will be increased, which may incur a decrease of fuel efficiency.

In the related electromagnetic shielding plate 2, the substrate 3 and the electromagnetic shielding material 4 must be bonded to each other. This will lead to such a problem that production and/or installation will be complicated.

SUMMARY OF THE INVENTION

The present invention has been made in order to solve the above described problems, and an object of the present invention is to provide an electromagnetic shielding plate which can be obtained by a simple process, made light, and has high electromagnetic shielding effects, and also to provide an electromagnetic shielding structure composed of the described electromagnetic shielding plates.

In order to attain the above described object, there is provided, according to the present invention, an electromagnetic shielding plate comprising hollow particle dispersed composite material which includes a metal matrix containing therein hollow particles formed of inorganic compound.

The electromagnetic shielding plate material having such a composition can be remarkably made light as compared with the conventional substrate, and its electromagnetic shielding property can be also enhanced. In addition, there is no need of a step of bonding the substrate and the electromagnetic shielding material as in the prior art.

Further, there is provided according to the present invention, an electromagnetic shielding structure which includes a plurality of the above described electromagnetic shielding plates which are connected to each other in two dimensions or in three dimensions.

This electromagnetic shielding structure such as an electromagnetic shielding room or box, for example, is composed of the light weight electromagnetic shielding plates. Accordingly, its skeleton need not be reinforced, and even though the structure is employed to be mounted on a vehicle, a decrease of fuel efficiency due to an increase of weight will not be incurred.

DETAILED DESCRIPTION OF PREFERRED EMBODIMENTS

Figure 1:
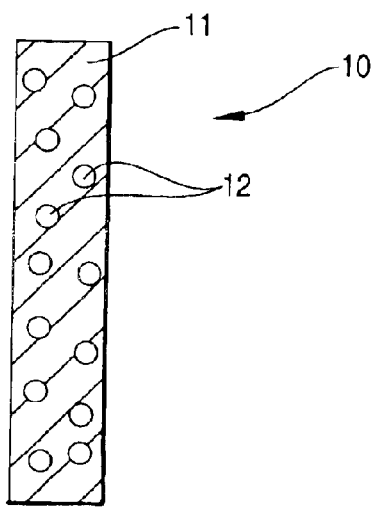
FIG. 1 is a sectional view schematically showing one embodiment of an electromagnetic shielding plate according to the present invention.

Now, an embodiment of the present invention will be described referring to the drawings.

FIG. 1 is a sectional view schematically showing an electromagnetic shielding plate 10 according to the present invention. This electromagnetic shielding plate 10 is hollow particle dispersed composite material which includes a metal matrix 11 and fine hollow particles 12 formed of inorganic compound and dispersed in the metal matrix 11 (hereinafter referred to as inorganic hollow particles).

The metal matrix 11 is not particularly limited, but may preferably be as light as possible. In this embodiment, aluminum, aluminum alloy, magnesium, or magnesium alloy can be preferably used as the matrix. Particularly, aluminum or aluminum alloy which is cheep in cost may be preferably used.

The inorganic hollow particles 12 are composed of heat resistant material such as oxides of $SiO_2$, $Al_2O_3$, CaO, MgO, for example, or nitrides or carbonates of similar metals or the like. Alternatively, they may be hollow particles composed of natural minerals such as silas balloon, pearlite, mullite, etc.

A particle diameter of the inorganic hollow particles is not particularly limited, but preferably may be in a range of 10 to 100 $\mu$m, and more particularly 50 to 100 $\mu$m. Moreover, the inorganic hollow particles 12 having different particle diameters may be mixed to be used. Although it is desirable that content of the inorganic hollow particles 12 in the hollow particle dispersed composite material is high in order to save weight, electromagnetic shielding effects will be decreased with an increase of the content. In the present invention, in order to attain the weight reduction while maintaining the electromagnetic shielding effects, the content of the inorganic hollow particles 12 is set to be 60% by weight at most. The lowest limit of the content can be appropriately set according to a degree of the weight reduction to be attained.

In order to obtain the electromagnetic shielding plate according to the present invention, it would be sufficient that the process includes charging a predetermined amount of the inorganic hollow particles 12 into a mold having a cavity in a form of a flat plate for example, pouring therein melted metal fluid to form the metal matrix 11, and then cooling. Therefore, there is no need of bonding the substrate 3 and the electromagnetic shielding material 4 as in the prior art, and the electromagnetic shielding plate can be advantageously produced.

Figure 4:
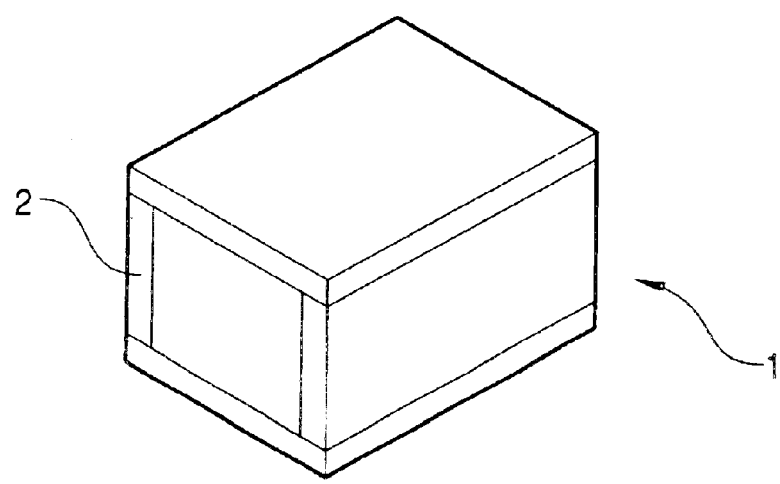
FIG. 4 is a perspective view schematically showing an example of an electromagnetic shielding room.
Figure 5:
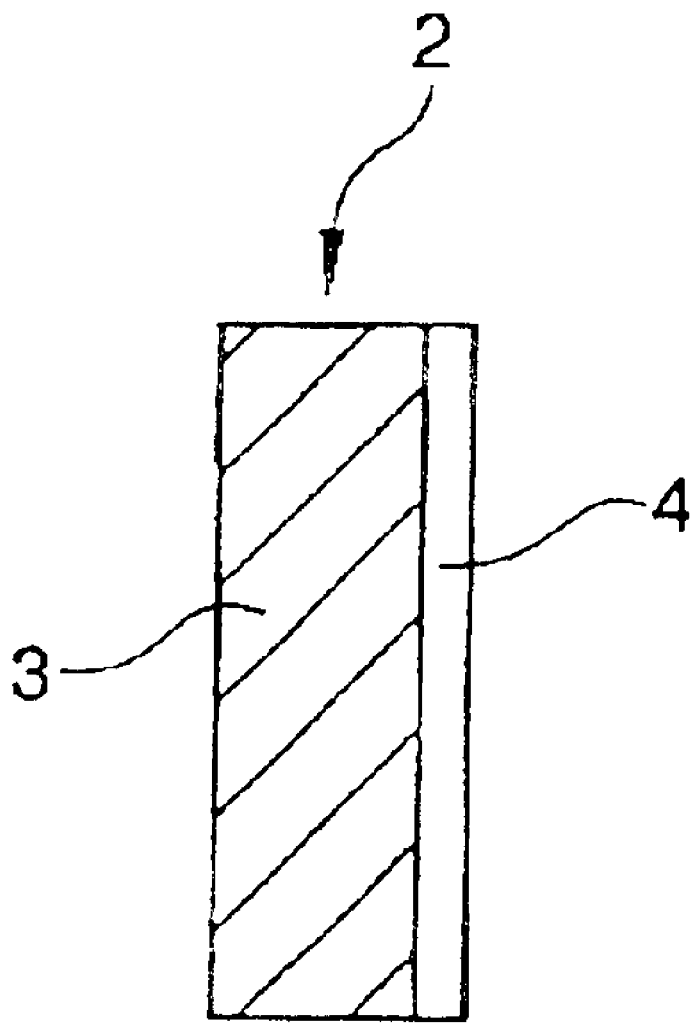
FIG. 5 is a sectional view schematically showing a related electromagnetic shielding plate.

As described above, the weight reduction can be achieved without damaging the electromagnetic shielding property, by composing the electromagnetic shielding plate 10 from the hollow particle dispersed composite material which has been produced by dispersing the inorganic hollow particles 12 in the metal matrix 11. This electromagnetic shielding plate 10 can be freely developed in two dimensions or in three dimensions, and can be utilized in architectural structures, such as an engine room of a motor car, side walls or a ceiling of a vehicle room, or an electromagnetic shielding room (See FIG. 4), etc. On such occasions, owing to the light weight of the material, the electromagnetic shielding plate can be applied to motor cars without a decrease of fuel efficiency. Moreover, in case where the electromagnetic shielding plates are applied to the architectural structures, the base or the skeleton need not be reinforced, and an increase of cost will not be incurred.

Although the electromagnetic shielding property of the electromagnetic shielding plate 10 varies according to a type of the metal matrix 11, an amount of the inorganic hollow particles 12 to be charged and so on, favorable electromagnetic shielding effects can be obtained in a frequency zone of 100 kHz to 1 GHz. Since there are frequent leaks of signals in this frequency zone from on-vehicle electronic apparatuses, the electromagnetic shielding plate 10 according to the present invention is especially advantageous for electromagnetic shielding of motor cars.

EXAMPLES

The present invention will be further described hereunder, referring to an example and comparative examples. However, the present invention is not limited to this example.

Example 1

Figure 2:
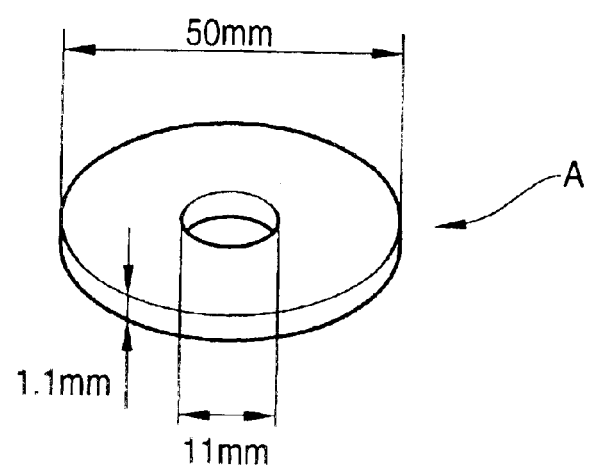
FIG. 2 is a perspective view showing a shape and sizes of samples of the electromagnetic shielding plate prepared in an example and in comparative examples.

Sample A
Hollow particles (particle diameter: 10 to 100 $\mu$m) formed of mullite balloon were charged into a cavity of a mold, and after the mold had been preheated to about 900° C., an aluminum alloy (specific gravity: 2.7) was poured into the mold. Then, the product was removed from the mold after cooled to a room temperature, and a sample A composed of hollow particle dispersed composite material was obtained. The product was in a shape of a doughnut having an outer diameter of 50 mm, an inner diameter of 11 mm, and a thickness of 1.1 mm as shown in FIG. 2. Moreover, amounts of the hollow particles and the aluminum alloy were adjusted so that content of the hollow particles may be 60% by weight. Specific gravity of the obtained sample A was 1.34, which was about one half of the specific gravity of the used aluminum alloy.

Comparative Example 1

Sample B
The same aluminum alloy as used in the production of the sample A was molded into the same shape as the sample A, and denoted as a sample B.

Comparative Example 2

Sample C
Brass was molded into the same shape as the sample A, and denoted as a sample C.

Electromagnetic Shielding Test

The above described samples were subjected to electromagnetic shielding tests according to Mitsubishi electric wire method. Specifically, the samples were mounted on a sample holder provided with shielding material, then, signals having measuring frequencies were inputted from a tracking generator, and leaked amounts were measured with a spectrum analyzer. For information, there is mounted on the sample holder an attenuator (10 dB) for attenuating unwanted reflection due to an impedance mismatch. The signal from the tracking generator is amplified with a power amplifier (40 dB) via the attenuator (10 dB), and inputted into the sample holder via a further power attenuator (20 dB).

Figure 3:
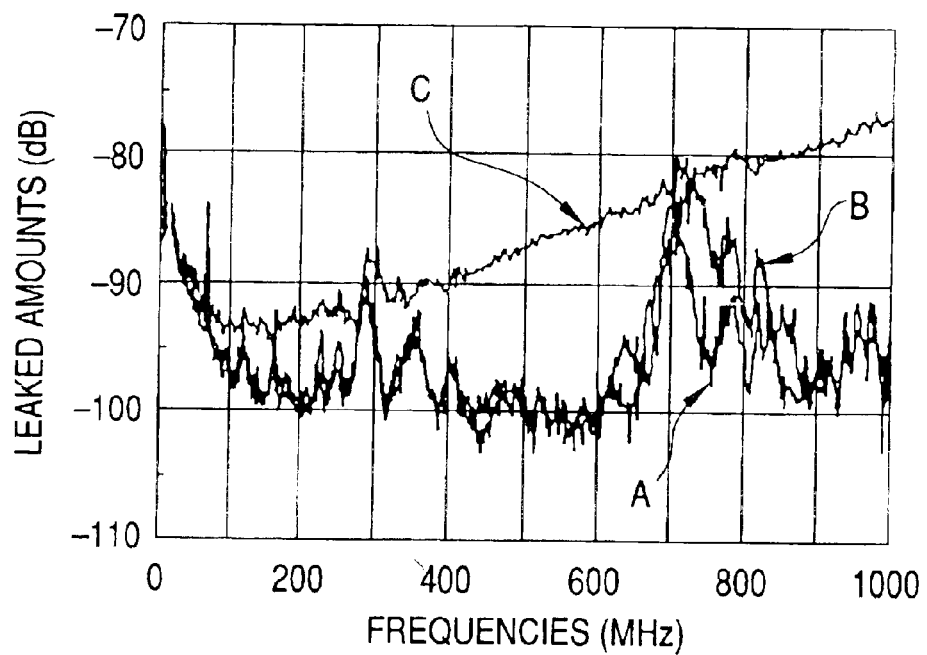
FIG. 3 is a graph showing results of electromagnetic shielding tests conducted on the samples.

The results obtained are shown in FIG. 3. It has been found that the sample A has remarkably excellent electromagnetic shielding property as compared with the sample C made of brass, and a similar degree of electromagnetic shielding property as compared with the sample B made of the aluminum alloy which was employed as the metal matrix, over an entire zone of the measured frequencies, and that the sample A has more excellent electromagnetic shielding property especially in a high frequency zone above 600 MHz.

As fully described herein above, according to the present invention, the electromagnetic shielding plate is composed of the hollow particle dispersed composite material having the inorganic hollow particles contained in the metal matrix. Accordingly, in spite of the light weight, the electromagnetic shielding property of a similar or higher degree than a single substrate of the employed metal-matrix can be obtained. In addition, the electromagnetic shielding plate can be advantageously produced without necessity of bonding the substrate and the electromagnetic shielding material.

What is claimed is:

1. An electromagnetic shielding structure comprising a plurality of electromagnetic shielding plates comprising hollow particle dispersed composite material which include a metal matrix containing therein hollow particles formed of inorganic compound, which are connected to each other in two dimensions or in three dimensions, wherein the hollow particles include at least one of oxides, nitrides, carbonates and natural minerals.

2. The electromagnetic shielding plate according to claim 1, wherein the metal matrix includes one of aluminum, aluminum alloy, magnesium, and magnesium alloy.

3. The electromagnetic shielding plate according to claim 1, wherein content of the hollow particles is 60% or less.

4. The electromagnetic shielding plate according to claim 1, wherein the hollow particles are contained in the metal matrix so as to obtain electromagnetic shielding effect in a frequency zone of 100 kHz to 1 GHz.

* * * * *